United States Patent
Sawabe

(10) Patent No.: US 9,981,343 B2
(45) Date of Patent: May 29, 2018

(54) LASER PROCESSING APPARATUS

(71) Applicant: DISCO CORPORATION, Tokyo (JP)

(72) Inventor: Taiki Sawabe, Tokyo (JP)

(73) Assignee: Disco Corporation, Tokyo (JP)

( * ) Notice: Subject to any disclaimer, the term of this patent is extended or adjusted under 35 U.S.C. 154(b) by 818 days.

(21) Appl. No.: 14/450,780

(22) Filed: Aug. 4, 2014

(65) Prior Publication Data
US 2015/0034617 A1  Feb. 5, 2015

(30) Foreign Application Priority Data

Aug. 5, 2013 (JP) ................................ 2013-162547

(51) Int. Cl.

| | |
|---|---|
| *B23K 26/06* | (2014.01) |
| *B23K 26/067* | (2006.01) |
| *H01L 21/428* | (2006.01) |
| *H01L 21/463* | (2006.01) |
| *B23K 26/00* | (2014.01) |
| *B23K 26/40* | (2014.01) |
| *H01L 33/00* | (2010.01) |
| *B23K 103/00* | (2006.01) |

(52) U.S. Cl.
CPC ........ *B23K 26/067* (2013.01); *B23K 26/0057* (2013.01); *B23K 26/0608* (2013.01); *B23K 26/0648* (2013.01); *B23K 26/0676* (2013.01); *B23K 26/40* (2013.01); *H01L 21/428* (2013.01); *H01L 21/463* (2013.01); *B23K 2203/50* (2015.10); *H01L 33/005* (2013.01)

(58) Field of Classification Search
CPC . B23K 26/067; B23K 26/0648; H01L 21/463; H01L 33/005; H01L 21/428; H01L 33/00

USPC .................................................. 219/121.73
See application file for complete search history.

(56) References Cited

U.S. PATENT DOCUMENTS

| | | | | |
|---|---|---|---|---|
| 7,402,773 B2* | 7/2008 | Nomaru | ............. | B23K 26/0057 219/121.67 |
| 8,049,133 B2* | 11/2011 | Oba | ................... | B23K 26/0604 219/121.65 |
| 2006/0289410 A1* | 12/2006 | Morita | ................... | B23K 26/03 219/121.67 |

(Continued)

FOREIGN PATENT DOCUMENTS

| | | |
|---|---|---|
| JP | 2008-311404 | 12/2008 |
| JP | 2011-114018 | 6/2011 |

*Primary Examiner* — Dana Ross
*Assistant Examiner* — Joseph Iskra
(74) *Attorney, Agent, or Firm* — Greer Burns & Crain Ltd.

(57) ABSTRACT

A laser processing apparatus includes a beam splitting unit disposed between a pulsed laser beam oscillating unit and a condenser. The beam splitting unit includes a half-wave plate that rotates the plane of polarization of a pulsed laser beam, a birefringent lens that splits the pulsed laser beam that has passed through the half-wave plate into ordinary light and extraordinary light, the birefringent lens being formed by joining two kinds of crystalline bodies to each other across a curved plane of a concave surface and a convex surface, and a splitting angle adjusting unit that moves the birefringent lens in a direction orthogonal to the pulsed laser beam that has passed through the half-wave plate to change the angle of incidence with respect to the curved plane and adjust a beam splitting angle.

2 Claims, 9 Drawing Sheets

(56) References Cited

U.S. PATENT DOCUMENTS

2012/0261453 A1* 10/2012 Kajikawa ............ B23K 26/0652
225/1

* cited by examiner

FIG.9A
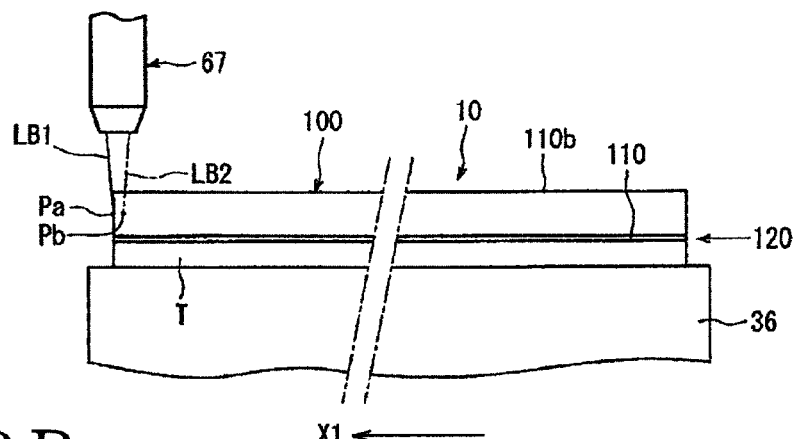
FIG.9B
FIG.9C
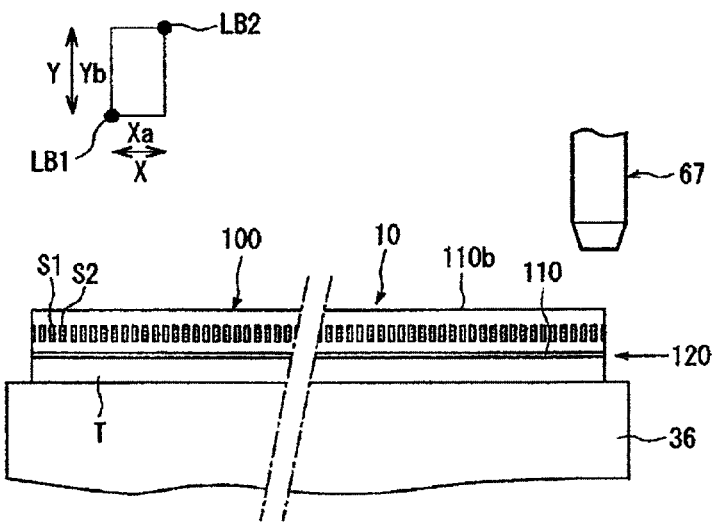
FIG.9D
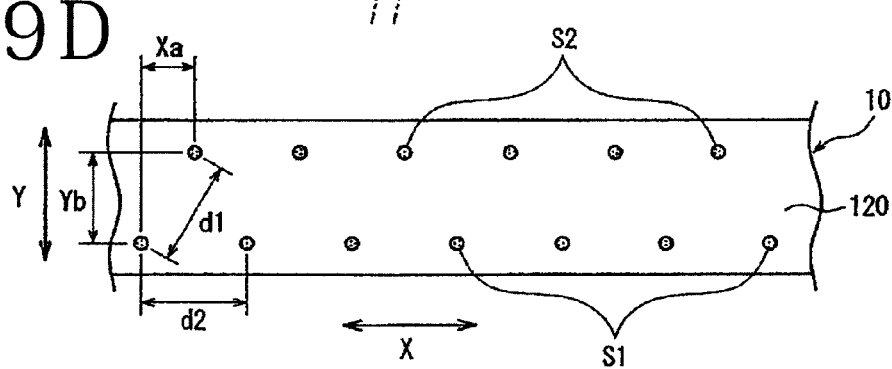

LASER PROCESSING APPARATUS

BACKGROUND OF THE INVENTION

Field of the Invention

The present invention relates to a laser processing apparatus for performing laser processing for a workpiece such as an optical device wafer or a semiconductor wafer.

Description of the Related Art

In an optical device manufacturing process, an optical device wafer is formed by forming optical devices such as light emitting diodes or laser diodes in plural areas obtained by depositing a light emitting layer composed of an n-type semiconductor layer and a p-type semiconductor layer over a surface of a sapphire substrate, silicon carbide substrate, gallium nitride substrate, etc. having a substantially circular disc shape and partitioning the light emitting layer by plural streets formed in a lattice manner. Then, the optical device wafer is divided along the streets to manufacture the individual optical devices.

The cutting of the above-described optical device wafer along the streets is generally performed by a cutting apparatus called a dicing saw. This cutting apparatus includes a chuck table that holds a workpiece, a cutting unit for cutting the workpiece held by this chuck table, and a cutting feed unit that causes the chuck table and the cutting unit to relatively move. The cutting unit includes a rotating spindle, a cutting blade mounted on this spindle, and a drive mechanism that rotationally drives the rotating spindle. The cutting blade is composed of a base having a circular disc shape and a ring-shaped cutting edge mounted on the side-surface peripheral part of this base. For example, the cutting edge is formed to a thickness of about 20 µm by fixing diamond abrasive grains having a grain size of about 3 µm to the base by electroforming. Nevertheless, because the sapphire substrate, silicon carbide substrate, gallium nitride substrate, etc. to form the optical device wafer have high Mohs hardness, there is a problem that cutting by the above-described cutting blade is not necessarily easy and the productivity is low.

In order to solve the above-described problem, as a method for dividing an optical device wafer along streets, a laser processing method is attempted in which a pulsed laser beam having such a wavelength as to be transmitted through the wafer is used and the wafer is irradiated with the pulsed laser beam with the light focus point positioned inside the area along which the cutting should be performed. The dividing method using this laser processing method is the following technique. Specifically, a modified layer is continuously formed inside the wafer along streets by irradiating the wafer with the pulsed laser beam having such a wavelength as to be transmitted through the wafer along the streets from one surface side of the wafer with the light focus point positioned inside the wafer. Then, the wafer is divided by applying an external force along the streets whose strength is lowered due to the forming of the modified layer (refer to e.g. Japanese Patent Laid-open No. 2011-114018).

Furthermore, the following technique has been proposed as a method for dividing an optical device wafer along streets. Specifically, a laser processing groove is formed along the streets by irradiating the wafer with a pulsed laser beam having such a wavelength as to be absorbed by the wafer along the streets. Then, the wafer is divided by applying an external force along the streets along which the laser processing groove is formed (refer to e.g. Japanese Patent Laid-open No. 2008-311404).

SUMMARY OF THE INVENTION

However, when a modified layer or a laser processing groove is formed for an optical device wafer along streets and then the optical device wafer is divided along the streets along which the modified layer or the laser processing groove is formed, there is a problem that the division surface becomes a flat surface and part of light from the light emitting layer is confined in the substrate, causing the lowering of the luminance of the optical device.

Therefore, an object of the present invention is to provide a laser processing apparatus that can perform laser processing for dividing an optical device wafer along streets in such a manner that the luminance of an optical device is enhanced.

In accordance with an aspect of the present invention, there is provided a laser processing apparatus comprising: a chuck table that holds a workpiece; a laser beam irradiator that irradiates the workpiece held by the chuck table with a laser beam; and a processing feed means that performs relative processing feeding of the chuck table and the laser beam irradiator, wherein the laser beam irradiator includes a pulsed laser beam oscillating means that oscillates a pulsed laser beam, a condenser that condenses the pulsed laser beam oscillated by the pulsed laser beam oscillating means and irradiates the workpiece held by the chuck table with the laser beam, and a beam splitting means that is disposed between the pulsed laser beam oscillating means and the condenser and splits the pulsed laser beam oscillated by the pulsed laser beam oscillating means, and the beam splitting means includes a half-wave plate that rotates a plane of polarization of the pulsed laser beam oscillated by the pulsed laser beam oscillating means, a birefringent lens that splits the pulsed laser beam that has passed through the half-wave plate into ordinary light and extraordinary light, the birefringent lens being formed by joining two kinds of crystalline bodies to each other across a curved plane of a concave surface and a convex surface, and a splitting angle adjusting means that moves the birefringent lens in a direction orthogonal to the pulsed laser beam that has passed through the half-wave plate to change an angle of incidence of the pulsed laser beam with respect to the curved plane and adjust a beam splitting angle.

Preferably, the beam splitting means further includes a quarter-wave plate that is disposed between the birefringent lens and the condenser and changes a linearly-polarized pulsed laser beam oscillated by the pulsed laser beam oscillating means to a circularly-polarized pulsed laser beam.

In the laser processing apparatus of the present invention, the beam splitting means includes the half-wave plate that rotates the plane of polarization of the pulsed laser beam, the birefringent lens that splits the pulsed laser beam that has passed through the half-wave plate into ordinary light and extraordinary light, the birefringent lens being formed by joining two kinds of crystalline bodies to each other across the curved plane of the concave surface and the convex surface, and the beam splitting angle adjusting means that moves the birefringent lens in a direction orthogonal to the pulsed laser beam that has passed through the half-wave plate to change the angle of incidence with respect to the curved plane and adjust the beam splitting angle. Thus, the pulsed laser beam can be split into the ordinary light and the extraordinary light. In addition, a light focus point of the ordinary light and a light focus point of the extraordinary light can be so positioned as to be offset from each other in the X-axis direction and the Y-axis direction.

Therefore, for example, modified layers serving as an origin of cutting can be formed along streets on an optical device wafer. Thus, when the optical device wafer is divided into individual optical devices along the streets along which the modified layers are formed, the cut surface is formed into a zigzag shape. This can enhance the luminance of the optical device.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIGS. 9A to 9D are explanatory diagrams showing a modified layer forming step carried out by the laser processing apparatus shown in FIG. 1.

DETAILED DESCRIPTION OF THE PREFERRED EMBODIMENT

Figure 1:
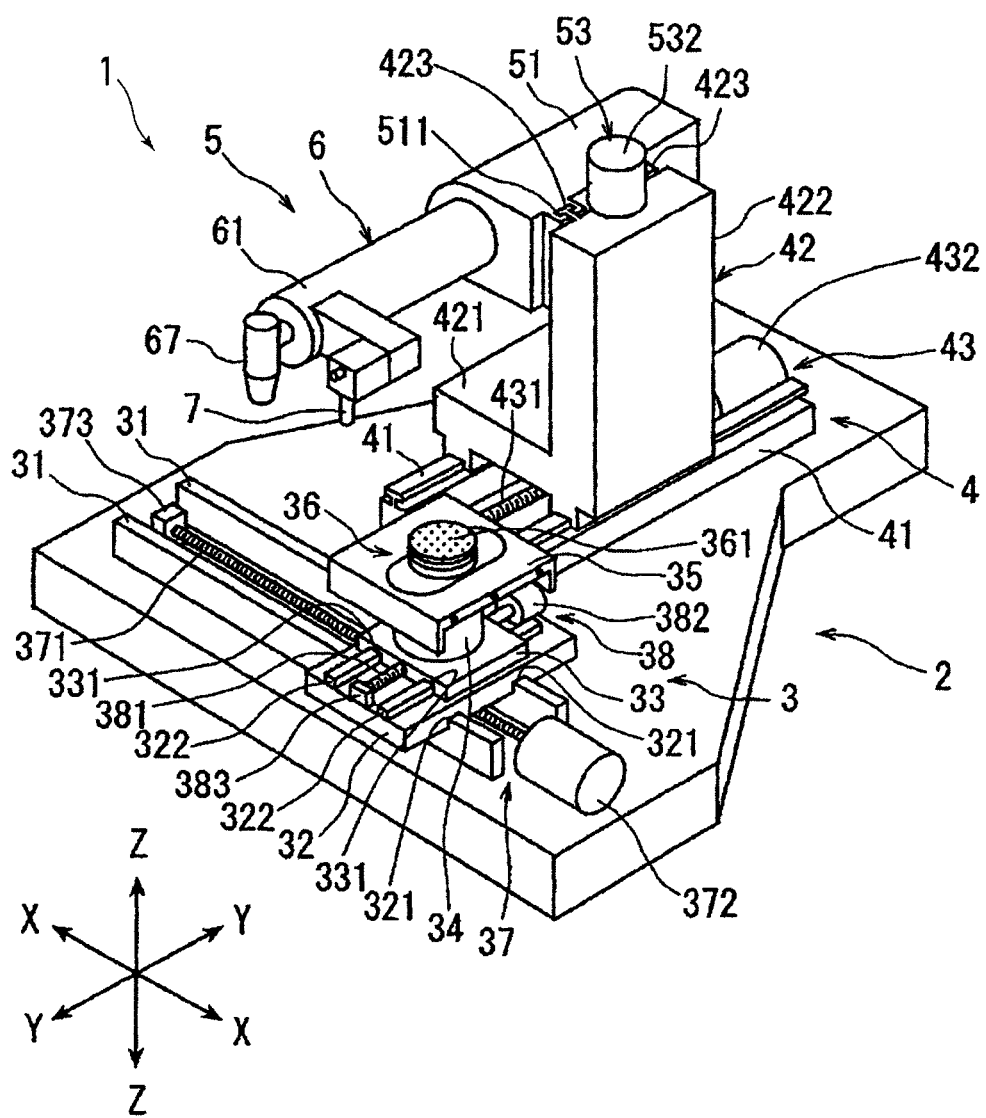
FIG. 1 is a perspective view of a laser processing apparatus configured in accordance with the present invention.

A preferred embodiment of a laser processing apparatus configured in accordance with the present invention will be described in detail below with reference to the accompanying drawings. In FIG. 1, a perspective view of a laser processing apparatus 1 configured in accordance with the present invention is shown. The laser processing apparatus 1 shown in FIG. 1 includes a stationary pedestal 2, a chuck table mechanism 3 that is disposed on this stationary pedestal 2 movably in a processing feed direction indicated by an arrow X and holds a workpiece, a laser beam irradiation unit support mechanism 4 disposed on the stationary pedestal 2 movably in an indexing direction indicated by an arrow Y orthogonal to the direction indicated by the arrow X, and a laser beam irradiation unit 5 disposed on this laser beam irradiation unit support mechanism 4 movably in a focus position adjustment direction indicated by an arrow Z.

The chuck table mechanism 3 includes a pair of guide rails 31 disposed on the stationary pedestal 2 in parallel along the direction indicated by the arrow X, a first sliding block 32 disposed on these guide rails 31 movably in the direction indicated by the arrow X, and a second sliding block 33 disposed on this first sliding block 32 movably in the direction indicated by the arrow Y. The chuck table mechanism 3 further includes a support table 35 supported by a cylindrical member 34 over the second sliding block 33 and a chuck table 36 as a workpiece holder. This chuck table 36 has a workpiece holding surface 361 formed from a porous material and a wafer as a workpiece is held on the chuck table 36 by a suction measure (not shown). The chuck table 36 is rotated by a pulsed motor (not shown) disposed in the cylindrical member 34.

For the first sliding block 32, a pair of guided grooves 321 fitted to the pair of guide rails 31 are made in its lower surface and a pair of guide rails 322 formed in parallel along the direction indicated by the arrow Y are provided on its upper surface. The first sliding block 32 formed in this manner is configured movably in the direction indicated by the arrow X along the pair of guide rails 31 through the fitting of the guided grooves 321 to the pair of guide rails 31. The chuck table mechanism 3 includes a processing feed unit 37 for moving the first sliding block 32 in the direction indicated by the arrow X along the pair of guide rails 31. The processing feed unit 37 includes a male screw rod 371 disposed between the pair of guide rails 31 in parallel and a drive source such as a pulsed motor 372 for rotationally driving this male screw rod 371. One end of the male screw rod 371 is rotatably supported by a bearing block 373 fixed to the stationary pedestal 2 and the other end is transmissibly connected to the output shaft of the pulsed motor 372. The male screw rod 371 is screwed to a through female screw hole formed in a female screw block (not shown) provided in a protruding manner on the lower surface of the center part of the first sliding block 32. Therefore, by driving the male screw rod 371 by the pulsed motor 372 to cause the forward rotation and reverse rotation of it, the first sliding block 32 is moved in the processing feed direction indicated by the arrow X along the guide rails 31.

In the lower surface of the second sliding block 33, a pair of guided grooves 331 fitted to the pair of guide rails 322 provided on the upper surface of the first sliding block 32 are made. The second sliding block 33 is configured movably in the direction indicated by the arrow Y through the fitting of these guided grooves 331 to the pair of guide rails 322. The chuck table mechanism 3 includes a first indexing feed unit 38 for moving the second sliding block 33 in the direction indicated by the arrow Y along the pair of guide rails 322 provided on the first sliding block 32. The first indexing feed unit 38 includes a male screw rod 381 disposed between the pair of guide rails 322 in parallel and a drive source such as a pulsed motor 382 for rotationally driving this male screw rod 381. One end of the male screw rod 381 is rotatably supported by a bearing block 383 fixed to the upper surface of the first sliding block 32 and the other end is transmissibly connected to the output shaft of the pulsed motor 382. The male screw rod 381 is screwed to a through female screw hole formed in a female screw block (not shown) provided in a protruding manner on the lower surface of the center part of the second sliding block 33. Therefore, by driving the male screw rod 381 by the pulsed motor 382 to cause the forward rotation and reverse rotation of it, the second sliding block 33 is moved in the indexing feed direction indicated by the arrow Y along the guide rails 322.

The laser beam irradiation unit support mechanism 4 includes a pair of guide rails 41 disposed on the stationary pedestal 2 in parallel along the direction indicated by the arrow Y and a movable support base 42 disposed on these guide rails 41 movably in the direction indicated by the arrow Y. This movable support base 42 is composed of a moving support part 421 movably disposed on the guide rails 41 and a mounting part 422 attached to this moving support part 421. On one side surface of the mounting part 422, a pair of guide rails 423 extending along a direction indicated by the arrow Z are provided in parallel. The laser beam irradiation unit support mechanism 4 includes a second indexing feed unit 43 for moving the movable support base 42 in the direction indicated by the arrow Y along the pair of guide rails 41. The second indexing feed unit 43 includes a male screw rod 431 disposed between the pair of guide rails 41 in parallel and a drive source such as a pulsed motor 432 for rotationally driving this male screw rod 431. One end of the male screw rod 431 is rotatably supported by a bearing block (not shown) fixed to the stationary pedestal 2 and the other end is transmissibly connected to the output shaft of the pulsed motor 432. The male screw rod 431 is screwed to a female screw hole formed in a female screw block (not shown) provided in a protruding manner on the lower surface of the center part of the moving support part 421 forming the movable support base 42. Therefore, by driving the male screw rod 431 by the pulsed motor 432 to cause the forward rotation and reverse rotation of it, the movable support base 42 is moved in the indexing feed direction indicated by the arrow Y along the guide rails 41.

The laser beam irradiation unit 5 includes a unit holder 51 and a laser beam irradiator 6 attached to this unit holder 51. In the unit holder 51, a pair of guided grooves 511 slidably fitted to the pair of guide rails 423 provided on the mounting part 422 are made. The unit holder 51 is supported movably in the direction indicated by the arrow Z through the fitting of these guided grooves 511 to the guide rails 423.

The laser beam irradiation unit 5 includes a light focus point position adjuster 53 for moving the unit holder 51 in the direction indicated by the arrow Z along the pair of guide rails 423. The light focus point position adjuster 53 includes a male screw rod (not shown) disposed between the pair of guide rails 423 and a drive source such as a pulsed motor 532 for rotationally driving this male screw rod. By driving the male screw rod (not shown) by the pulsed motor 532 to cause the forward rotation or reverse rotation of it, the unit holder 51 and the laser beam irradiator 6 are moved in the direction indicated by the arrow Z along the pair of guide rails 423. In the embodiment shown in the diagram, the laser beam irradiator 6 is moved upward by driving by the pulsed motor 532 for the forward rotation and the laser beam irradiator 6 is moved downward by driving by the pulsed motor 532 for the reverse rotation.

The laser beam irradiator 6 includes a cylindrical casing 61 that is fixed to the unit holder 51 and extends substantially horizontally. This laser beam irradiator 6 will be described with reference to FIG. 2. The laser beam irradiator 6 shown in FIG. 2 includes a pulsed laser beam oscillating unit 62 disposed in the casing 61, an output power adjuster 63 that adjusts the output power of a pulsed laser beam oscillated by this pulsed laser beam oscillating unit 62, and a beam expander 64 that reduces the beam diameter of the pulsed laser beam whose output power is adjusted by this output power adjuster 63 (e.g. reduces the beam diameter from φ4 mm to φ1 mm). The laser beam irradiator 6 further includes a splitting unit (beam splitting unit) 65 that splits the pulsed laser beam whose beam diameter is reduced by the beam expander 64, a quarter-wave plate 66 that changes the linearly-polarized pulsed laser beams obtained by splitting by this splitting unit 65 to circularly-polarized beams, and a condenser 67 that condenses the pulsed laser beams converted to the circularly-polarized beams by this quarter-wave plate 66 and irradiates a workpiece W held by the chuck table 36 with the pulsed laser beams. The pulsed laser beam oscillating unit 62 is composed of a pulsed laser oscillator 621 formed of a YAG laser oscillator or a YVO4 laser oscillator and a repetition frequency setter 622 annexed to it. The pulsed laser beam oscillating unit 62 configured in this manner oscillates a linearly-polarized pulsed laser beam LB.

In the present embodiment, the splitting unit 65 included in the laser beam irradiator 6 includes a half-wave plate 651, a birefringent lens 652, and a splitting angle adjusting unit 653. The half-wave plate 651 rotates the plane of polarization of the pulsed laser beam LB that is oscillated by the pulsed laser beam oscillating unit 62 and is reduced in the beam diameter by the beam expander 64 so that the plane of polarization may be at 45 degrees with respect to the birefringent lens 652. The birefringent lens 652 is composed of a YVO4 crystalline body 652a having a concave surface and a LASF35 glass body 652b having a convex surface in such a manner that they are joined to each other across the curved plane of the concave surface and the convex surface. The birefringent lens 652 splits the pulsed laser beam LB whose beam diameter is reduced by the beam expander 64 into ordinary light LB1 and extraordinary light LB2.

Figure 3:
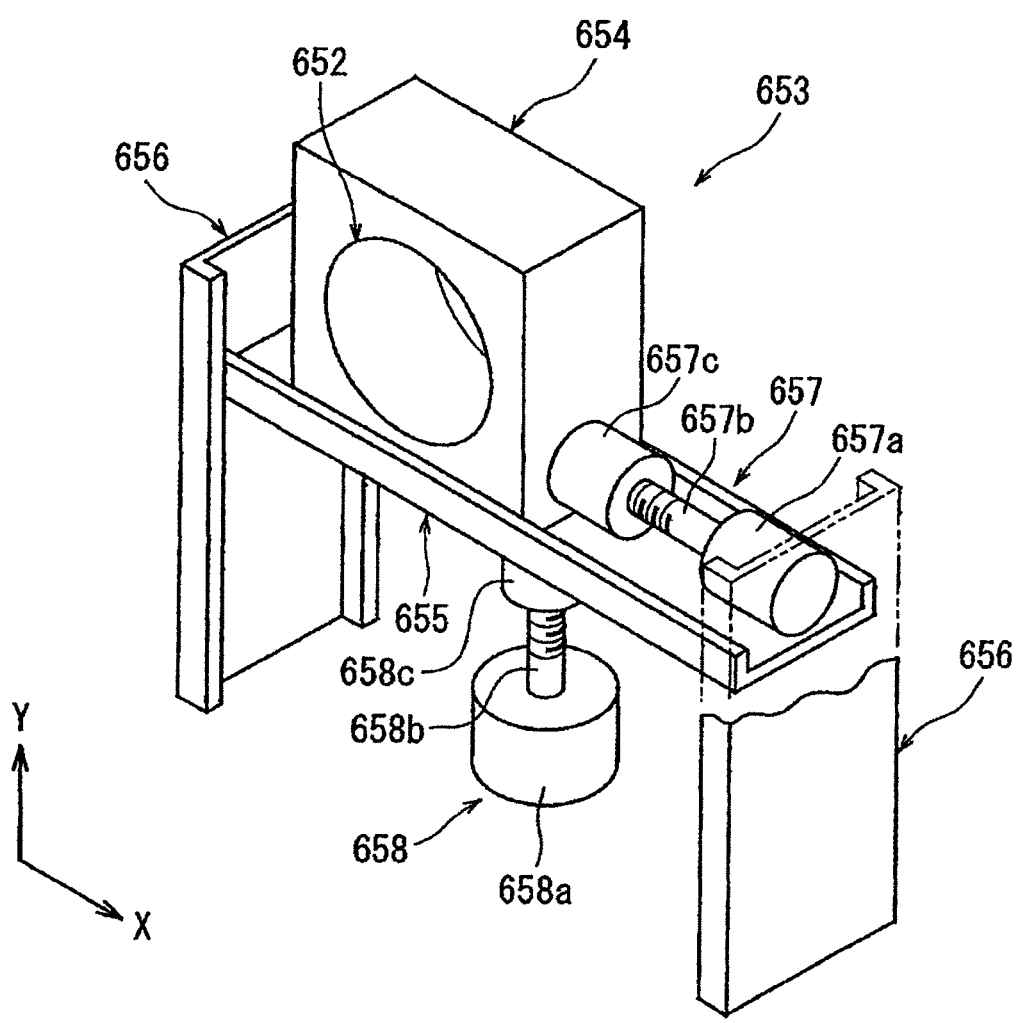
FIG. 3 is a perspective view of a splitting angle adjusting unit forming a splitting unit that splits a pulsed laser beam oscillated by a pulsed laser beam oscillating unit of the laser beam irradiator shown in FIG. 2.

The splitting angle adjusting unit 653 included in the splitting unit 65 has a function to move the birefringent lens 652 in a direction orthogonal to the pulsed laser beam LB that has passed through the half-wave plate 651 to change the angle of incidence with respect to the curved plane of the concave surface and the convex surface and adjust the splitting angle. This splitting angle adjusting unit 653 will be described with reference to FIG. 3. The splitting angle adjusting unit 653 in the embodiment shown in FIG. 3 includes a lens holding case 654 that holds the birefringent lens 652, a moving table 655 that supports this lens holding case 654 movably in a processing feed direction indicated by an arrow X, and a pair of guide rails 656 that support this moving table 655 movably in an indexing direction indicated by an arrow Y. The splitting angle adjusting unit 653 further includes a first moving unit 657 that moves the lens holding case 654 in the processing feed direction indicated by the arrow X and a second moving unit 658 that moves the moving table 655 in the indexing direction indicated by the arrow Y.

The first moving unit 657 is formed of a first pulsed motor 657a, a male screw rod 657b connected to this first pulsed motor 657a, and a female screw block 657c that is connected to the lens holding case 654 and to which the male screw rod 657b is screwed. By driving the male screw rod 657b by the first pulsed motor 657a to cause the forward rotation and reverse rotation of it, the lens holding case 654 is moved in the processing feed direction indicated by the arrow X. The second moving unit 658 is formed of a second pulsed motor 658a, a male screw rod 658b connected to this second pulsed motor 658a, and a female screw block 658c that is connected to the moving table 655 and to which the male screw rod 658b is screwed. By driving the male screw rod 658b by the second pulsed motor 658a to cause the forward rotation and reverse rotation of it, the moving table 655 is moved in the indexing direction indicated by the arrow Y.

Figure 4A:
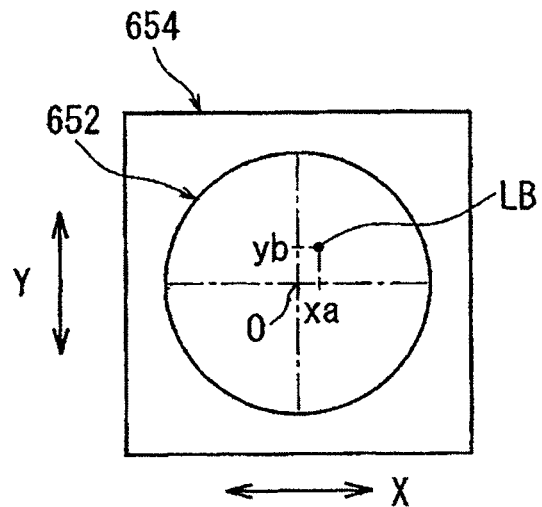
FIGS. 4A and 4B are explanatory diagrams showing the position of incidence of the pulsed laser beam in a birefringent lens forming the splitting unit that splits the pulsed laser beam oscillated by the pulsed laser beam oscillating unit of the laser beam irradiator shown in FIG. 2.
Figure 4B:
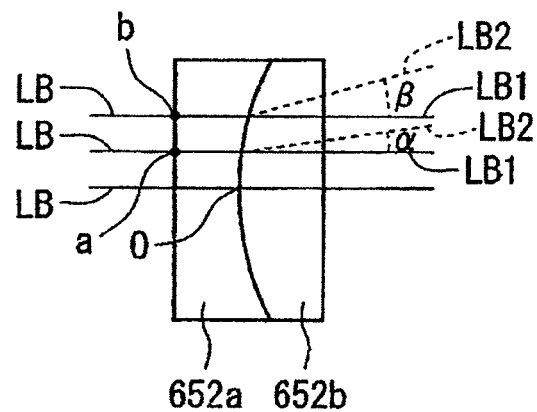

The splitting angle adjusting unit 653 configured in this manner actuates the first pulsed motor 657a to move the lens holding case 654 in the processing feed direction indicated by the arrow X, and actuates the second pulsed motor 658a to move the moving table 655 in the indexing direction indicated by the arrow Y. Thereby, the splitting angle adjusting unit 653 sets the position of incidence of the pulsed laser beam LB in the birefringent lens 652 at e.g. coordinates (xa, yb) with respect to the center (O) of the birefringent lens 652 as shown in FIG. 4A. Through the change in the position of incidence of the pulsed laser beam LB in this birefringent lens 652, the angle of incidence with respect to the curved plane can be changed, the curved plane being made by joining the concave surface and the convex surface of the YVO4 crystalline body 652a having the concave surface and the LASF35 glass body 652b having the convex surface, which form the birefringent lens 652, and the splitting angle of the ordinary light LB1 and the extraordinary light LB2 changes depending on the position of incidence of the pulsed laser beam LB as shown in FIG. 4B. Specifically, the pulsed laser beam LB is not split when the position of incidence of the pulsed laser beam LB is the center (O) of the birefringent lens 652. When the position of incidence of the pulsed laser beam LB is (a), the pulsed laser beam LB is split into the ordinary light LB1 and the extraordinary light LB2 at a splitting angle of ($\alpha$). When the position of incidence of the pulsed laser beam LB is (b), the pulsed laser beam LB is split into the ordinary light LB1 and the extraordinary light LB2 at a splitting angle of ($\beta$). In this manner, the splitting angle of the ordinary light LB1 and the extraordinary light LB2 becomes larger when the position of incidence of the pulsed laser beam LB is positioned on the more peripheral side relative to the center (O) of the birefringent lens 652.

The quarter-wave plate 66 changes the linearly-polarized ordinary light LB1 and extraordinary light LB2 obtained by splitting by the birefringent lens 652 to circularly-polarized light. The purpose of changing the linearly-polarized ordinary light LB1 and extraordinary light LB2 to circularly-polarized light by using the quarter-wave plate 66 in this manner is to make the accuracy of processing with the ordinary light LB1 identical to that with the extraordinary light LB2.

Figure 2:
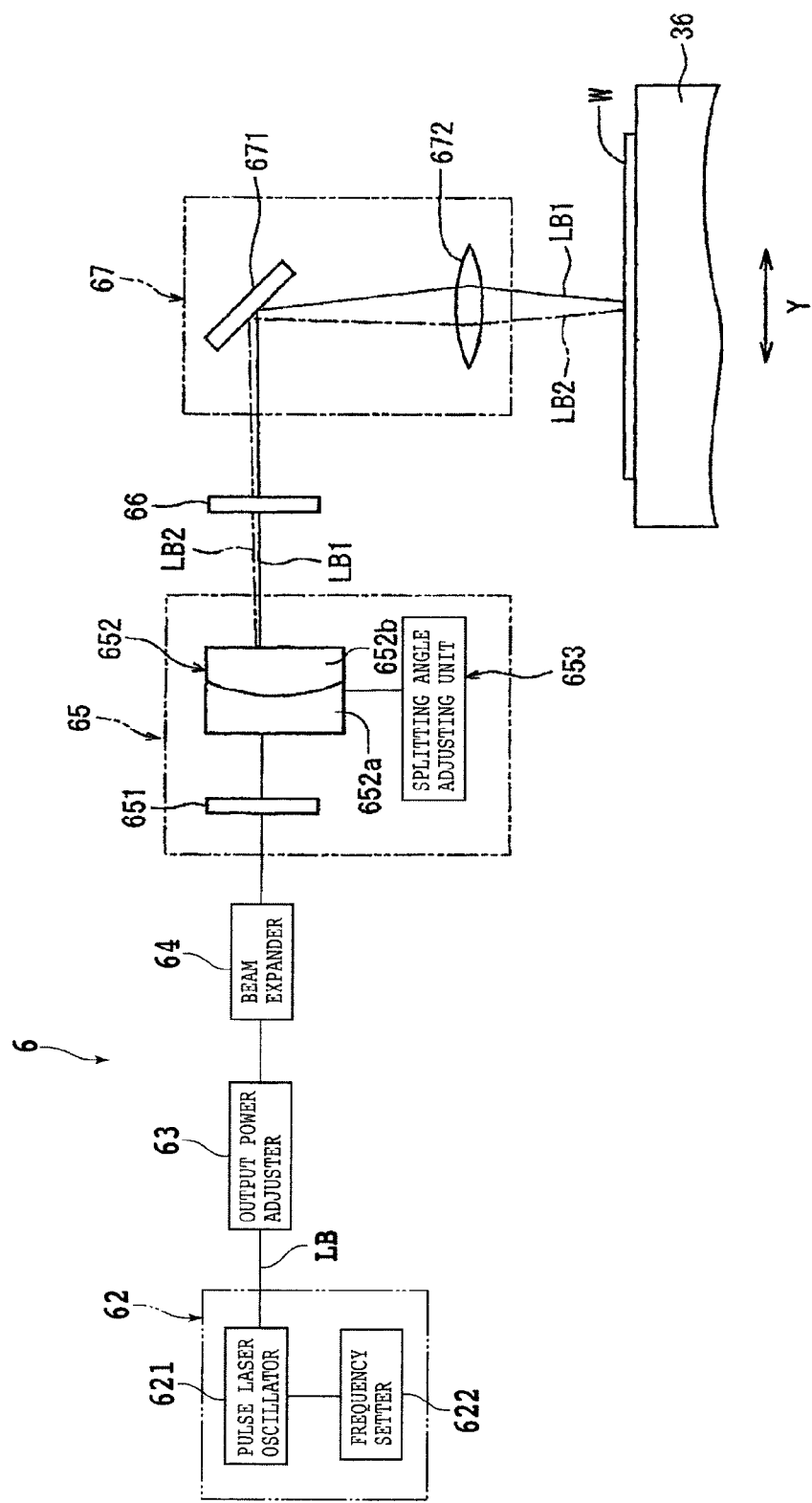
FIG. 2 is a block configuration diagram of a laser beam irradiator mounted in the laser processing apparatus shown in FIG. 1.
Figure 5:
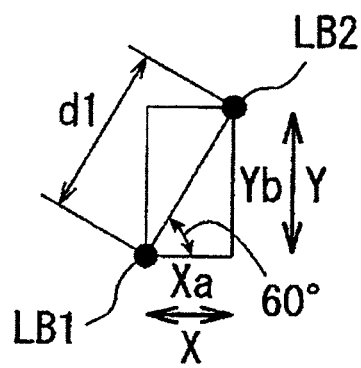
FIG. 5 is an explanatory diagram showing light focus points of ordinary light and extraordinary light focused by a focusing lens of the laser beam irradiator shown in FIG. 2.

As shown in FIG. 2, the condenser 67 included in the laser beam irradiator 6 is composed of a direction converting mirror 671 and a focusing lens 672. The direction converting mirror 671 converts the directions of the ordinary light LB1 and the extraordinary light LB2 that are obtained by splitting by the birefringent lens 652 and are changed to circularly-polarized light by the quarter-wave plate 66 to the downward direction in FIG. 2, i.e. to the direction toward the chuck table 36. The focusing lens 672 focuses each of the ordinary light LB1 and the extraordinary light LB2 whose directions are converted by the direction converting mirror 671 and irradiates the workpiece W held by the chuck table 36 with the focused light. The distance between the ordinary light LB1 and extraordinary light LB2 focused by this focusing lens 672 is adjusted by the splitting angle adjusting unit 653. In addition, the line coupling the ordinary light LB1 and the extraordinary light LB2 is adjusted to have a predetermined angle from the X-axis or Y-axis. In the present embodiment, as shown in FIG. 5, the adjustment is so made that the ordinary light LB1 and the extraordinary light LB2 are focused at distances of Xa and Yb from each other in the X-axis direction and the Y-axis direction, respectively, so that the line coupling them may be at 60° from the X-axis and the distance d1 therebetween may be 3 µm.

Referring back to FIG. 1, at the front end part of the casing 61 forming the laser beam irradiator 6, an imager 7 that detects a processing area on which laser processing should be performed by the laser beam irradiator 6 is disposed. In the present embodiment, this imager 7 is formed of, besides a normal imaging element (CCD) that performs imaging by a visible beam, an infrared illuminator that irradiates a workpiece with infrared, an optical system that captures the infrared irradiated by this infrared illuminator, an imaging element (infrared CCD) that outputs an electric signal corresponding to the infrared captured by this optical system, and so forth. The imager 7 sends an image signal obtained by imaging to a control unit (not shown).

Figure 6:
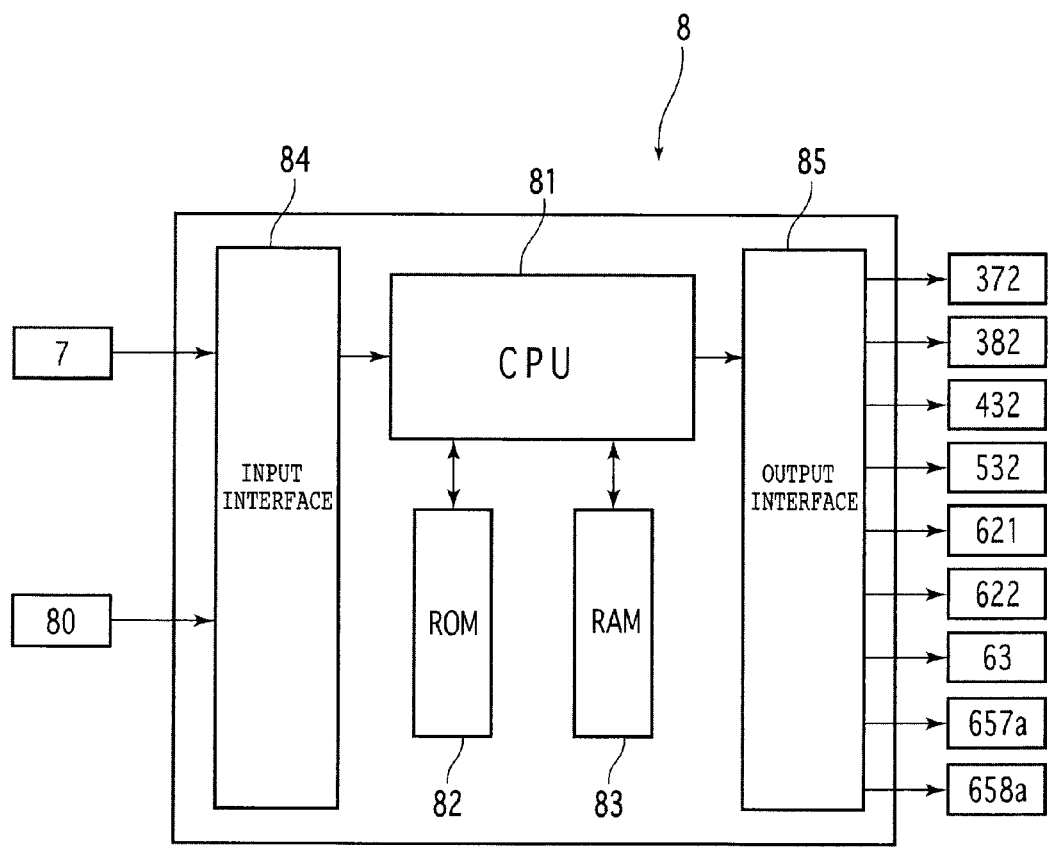
FIG. 6 is a block configuration diagram of a control unit mounted in the laser processing apparatus shown in FIG. 1.

The laser processing apparatus 1 includes a control unit 8 shown in FIG. 6. The control unit 8 is formed of a computer. It includes a central processing unit (CPU) 81 that executes arithmetic processing in accordance with a control program, a read only memory (ROM) 82 to store the control program and so forth, a readable/writable random access memory (RAM) 83 to store an arithmetic result and so forth, an input interface 84, and an output interface 85. To the input interface 84 of the control unit 8, detection signals from the imager 7, an input unit 80, and so forth are input. From the output interface 85 of the control unit 8, control signals are output to the pulsed motor 372, the pulsed motor 382, the pulsed motor 432, the pulsed motor 532, the pulsed laser oscillator 621 and the repetition frequency setter 622 forming the pulsed laser beam oscillating unit 62, the output power adjuster 63, the first pulsed motor 657a and the second pulsed motor 658a forming the splitting angle adjusting unit 653, and so forth.

Figure 7A:
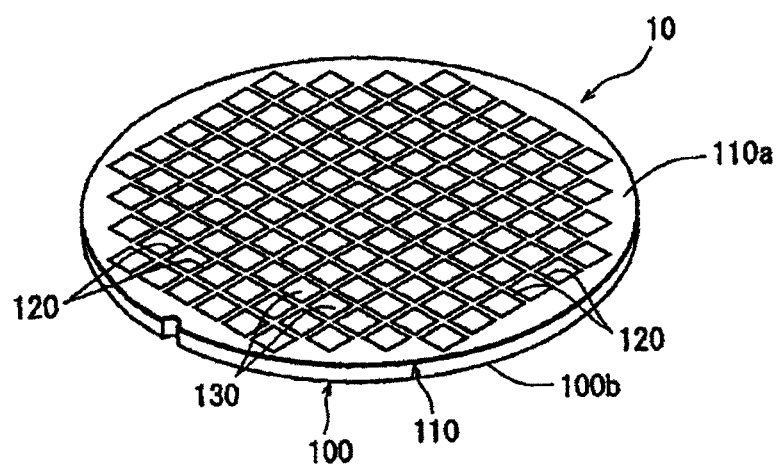
FIG. 7A is a perspective view of an optical device wafer as a workpiece.
Figure 7B:
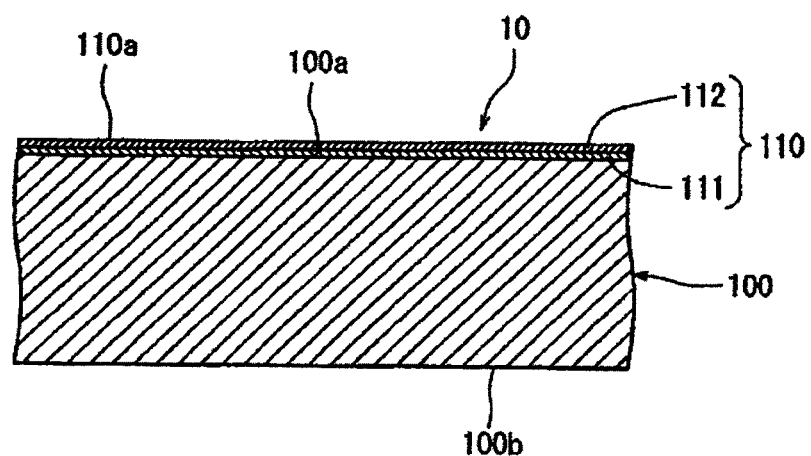
FIG. 7B is an enlarged sectional view of the major part of the optical device wafer.

The laser processing apparatus 1 is configured in the above-described manner. The operation thereof will be described below. In FIGS. 7A and 7B, a perspective view of an optical device wafer 10 as a wafer that is a workpiece to be processed by the laser processing apparatus 1 and an enlarged sectional view showing the major part of the optical device wafer 10 are shown. In the optical device wafer 10 shown in FIGS. 7A and 7B, over a front surface 100a of a sapphire substrate 100 having a thickness of e.g. 150 µm, a light emitting layer 110 composed of an n-type nitride semiconductor layer 111 and a p-type nitride semiconductor layer 112 is deposited to a thickness of e.g. 10 µm. Furthermore, optical devices 130 such as light emitting diodes or laser diodes are formed in plural areas obtained by partitioning the light emitting layer 110 by plural streets 120 formed in a lattice manner. A method for forming modified layers inside this optical device wafer 10 along the streets 120 will be described below.

Figure 8A:
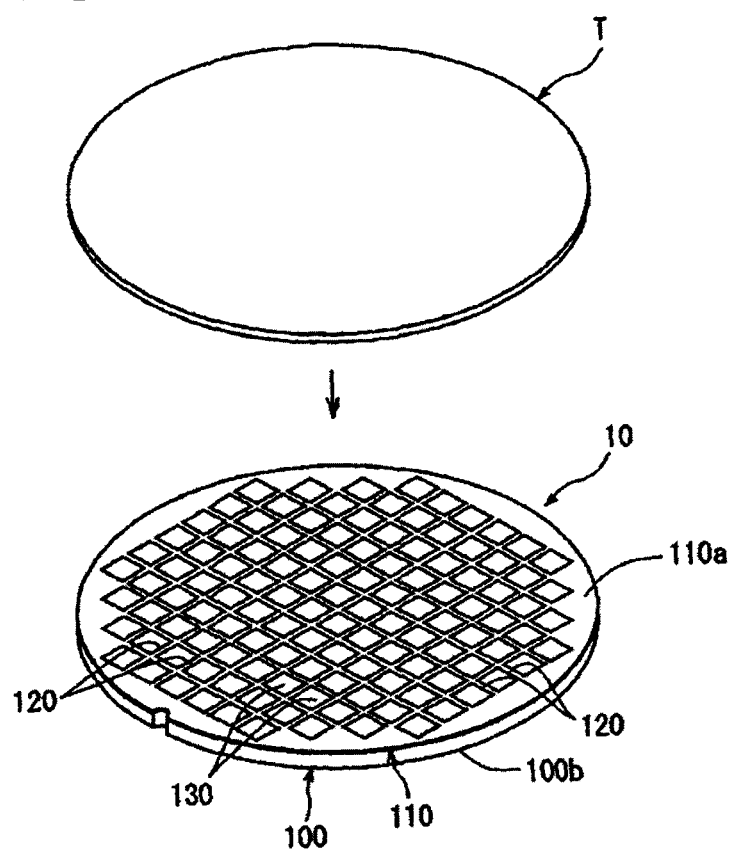
FIGS. 8A and 8B are explanatory diagrams showing a protective member attaching step of attaching a protective tape to a front surface of the optical device wafer shown in FIG. 7A.
Figure 8B:
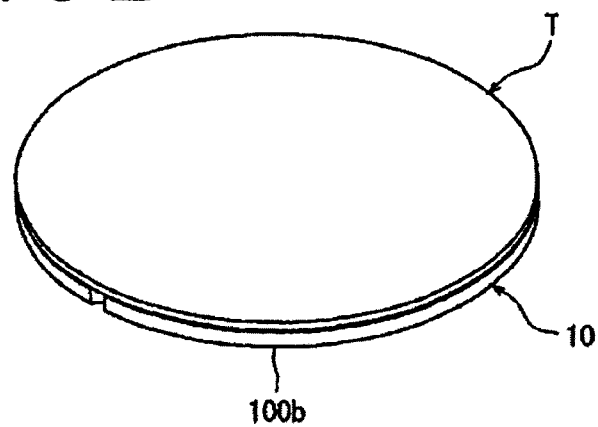

First, in order to protect the optical devices 130 formed on the front surface 100a of the sapphire substrate 100 forming the optical device wafer 10, a protective member attaching step of attaching a protective member to a surface 110a of the light emitting layer 110 of the optical device wafer 10 is carried out. Specifically, as shown in FIGS. 8A and 8B, a protective tape T as the protective member is attached to the surface 110a of the light emitting layer 110 of the optical device wafer 10. The protective tape T is made by applying acrylic resin-based paste to a thickness of about 5 µm on a surface of a sheet base composed of polyvinyl chloride (PVC) having a thickness of 100 µm for example.

After the above-described protective member attaching step is carried out, the side of the protective tape T of the optical device wafer 10 is placed on the chuck table 36 of the laser processing apparatus 1 shown in FIG. 1 and the optical device wafer 10 is held on this chuck table 36 by suction (wafer holding step). Therefore, in the optical device wafer 10 held on the chuck table 36, a back surface 100b of the sapphire substrate 100 is oriented upward.

The chuck table 36 that holds the optical device wafer 10 by suction as described above is positioned directly beneath the imager 7 by the processing feed unit 37. After the chuck table 36 is positioned directly beneath the imager 7, alignment work of detecting a processing area on which laser processing should be performed on the optical device wafer 10 is performed by the imager 7 and the control unit (not shown). Specifically, the imager 7 and the control unit (not shown) execute image processing such as pattern matching for performing position adjustment between the streets 120 formed along a first direction of the optical device wafer 10 and the condenser 67 of the laser beam irradiator 6 that irradiates a laser beam along the streets 120 to implement alignment of the laser beam irradiation position. Furthermore, alignment of the laser beam irradiation position is similarly implemented also for the streets 120 that are formed on the optical device wafer 10 and extend along a second direction orthogonal to the first direction. At this time, the front surface 110a, on which the streets 120 of the optical device wafer 10 are formed, is located on the lower side. However, because the imager 7 includes an imaging unit formed of the infrared illuminator, the optical system that captures infrared, the imaging element (infrared CCD) that outputs an electric signal corresponding to infrared, and so forth as described above, the streets 120 can be imaged from the back surface 100b of the sapphire substrate 100 forming the optical device wafer 10 in a see-through manner. Because the sapphire substrate 100 forming the optical device wafer 10 is transmissive to visible light, the infrared CCD does not necessarily needed to be used.

After the streets 120 formed on the optical device wafer 10 held on the chuck table 36 are detected in the above-described manner and alignment of the laser beam irradiation position is performed, the chuck table 36 is moved to the laser beam irradiation area above which the condenser 67 of the laser beam irradiator 6 is located as shown in FIG. 9A, and the predetermined street 120 is positioned directly beneath the condenser 67. Then, as shown in FIG. 9A, a light focus point Pa of the ordinary light LB1 and a light focus point Pb of the extraordinary light LB2 of the pulsed laser beam irradiated from the condenser 67 are positioned inside the sapphire substrate 100 forming the optical device wafer 10. The light focus point Pa of the ordinary light LB1 and the light focus point Pb of the extraordinary light LB2 of the pulsed laser beam irradiated from the condenser 67 are positioned at the distances of Xa and Yb from each other in the X-axis direction and the Y-axis direction, respectively, as shown in FIG. 9B.

Next, the control unit 8 actuates the pulsed laser beam oscillating unit 62 to irradiate, from the condenser 67, the ordinary light LB1 and the extraordinary light LB2 of the pulsed laser beam LB having such a wavelength as to be transmitted through the optical device wafer. In addition, the control unit 8 actuates the processing feed unit 37 to move the chuck table 36 in a direction indicated by an arrow X1 in FIG. 9A at a predetermined processing feed speed (modified layer forming step). Then, when the irradiation position of the condenser 67 reaches the other end of the street 120 (right end in FIG. 9C) as shown in FIG. 9C, the irradiation of the pulsed laser beam is stopped and the movement of the chuck table 36 is stopped. As a result, as shown in FIG. 9D, plural modified layers S1 by the ordinary light LB1 and plural modified layers S2 by the extraordinary light LB2 are so formed as to be offset from each other by Xa and Yb in the X-axis direction and the Y-axis direction, respectively, along the predetermined street 120.

The processing condition of the above-described modified layer forming step is set as follows for example.
Wavelength: 1064 nm
Repetition frequency: 100 kHz
Average output power: 1 W
Focused light spot diameter: φ1 μm
Processing feed speed: 300 mm/seconds Under this processing condition, in FIG. 9D, the distance d1 between the modified layer S1 and the modified layer S2 is 3 μm and the distance d2 between the modified layers S1 and between the modified layers S2 in the X-axis direction is 3 μm (300 mm/100 kHz=3 μm).

Figure 10:
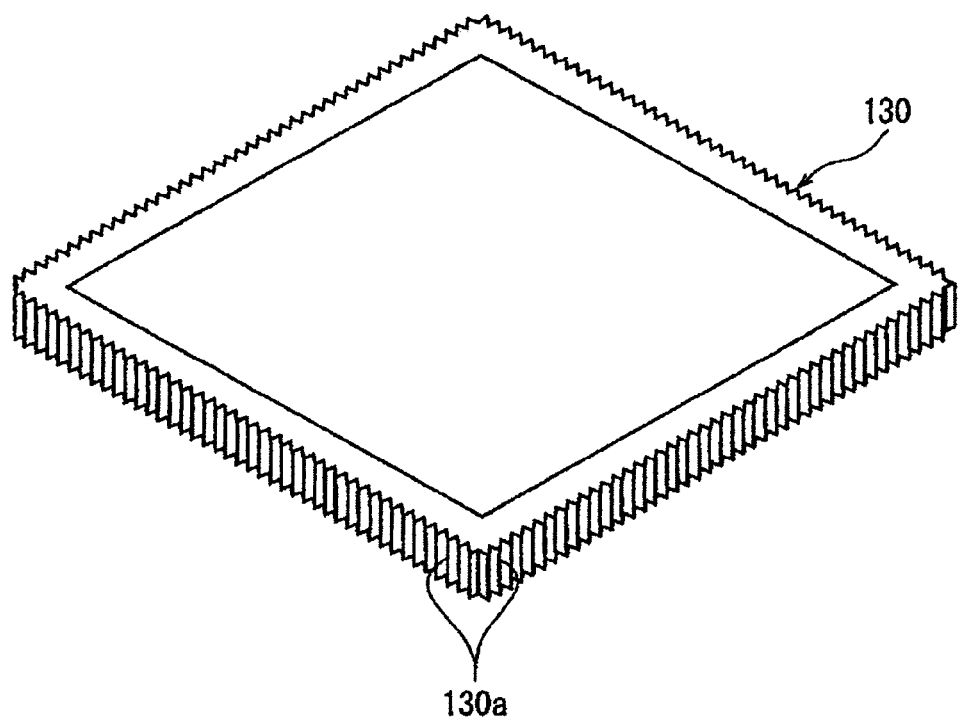
FIG. 10 is a perspective view of an optical device obtained by dividing the optical device wafer for which the modified layer forming step shown in FIG. 9 has been carried out.

After the modified layer forming step is carried out along all streets 120 formed along the first direction of the optical device wafer 10 as described above, the chuck table 36 that holds the optical device wafer 10 is set at a position resulting from rotation by 90 degrees. Then, the modified layer forming step is carried out along all streets 120 formed along the second direction orthogonal to the first direction of the optical device wafer 10. The optical device wafer 10 for which the modified layer forming step has been carried out along all streets 120 is conveyed to a wafer dividing step in which the optical device wafer 10 is cut along the streets 120, along which the modified layers S1 and S2 are formed. Then, by giving an external force along the streets 120, along which the modified layers S1 and S2 are formed, in the wafer dividing step, the optical device wafer 10 is divided into the individual optical devices 130 along the modified layers S1 and S2. In the optical device 130 obtained by the dividing in this manner, a cut surface 130a is formed into a zigzag shape as shown in FIG. 10, which enhances the luminance.

Next, another laser processing method using the above-described laser processing apparatus will be described.

In this laser processing method, the processing condition is set as follows.
Wavelength: 355 nm
Repetition frequency: 100 kHz
Average output power: 4 W
Focused light spot diameter: φ1 μm
Processing feed speed: 300 mm/seconds Under this set processing condition, in a semiconductor wafer having a form in which semiconductor devices are formed with a functional layer obtained by depositing, over a surface of a substrate of silicon or the like, a low dielectric constant insulator coat (Low-k film) formed of an inorganic substance-based film of SiOF, BSG (SiOB), or the like or an organic substance-based film that is a polymer film of a polyimide-based or parylene-based substance or the like, laser processing is so performed that a light focus point of ordinary light and a light focus point of extraordinary light are positioned at distances from each other in the X-axis direction and the Y-axis direction. Thereby, the functional layer can be removed along streets.

The present invention is not limited to the details of the above described preferred embodiment. The scope of the invention is defined by the appended claims and all changes and modifications as fall within the equivalence of the scope of the claims are therefore to be embraced by the invention.

What is claimed is:
1. A laser processing apparatus comprising:
a chuck table that holds a workpiece;
a laser beam irradiator that irradiates the workpiece held by the chuck table with a laser beam; and a processing feed means that performs relative processing feeding of the chuck table and the laser beam irradiator, wherein the laser beam irradiator includes a pulsed laser beam oscillating means that oscillates a pulsed laser beam, a condenser that condenses the pulsed laser beam oscillated by the pulsed laser beam oscillating means and irradiates the workpiece held by the chuck table with the laser beam, said condenser including a mirror which reflects incoming laser beam by a right angle toward said chuck table and a condensing lens for condensing the laser beam into a beam spot in the workpiece held by said chuck table; and a beam splitting means that is disposed between the pulsed laser beam oscillating means and the condenser and splits the pulsed laser beam oscillated by the pulsed laser beam oscillating means, and the beam splitting means includes a half-wave plate that rotates a plane of polarization of the pulsed laser beam oscillated by the pulsed laser beam oscillating means, a birefringent lens that splits the pulsed laser beam that has passed through the half-wave plate into ordinary light and extraordinary light, the birefringent lens combining a birefringent crystalline body and a glass body joined to each other across a curved plane of a concave surface and a convex surface, and a splitting angle adjusting means that moves the birefringent lens in a direction orthogonal to the pulsed laser beam that has passed through the half-wave plate to change an angle of incidence of the pulsed laser beam with respect to the curved plane and adjust a beam splitting angle.

2. The laser processing apparatus according to claim 1, wherein the beam splitting means further includes a quarter-wave plate that is disposed between the birefringent lens and the condenser and changes a linearly-polarized pulsed laser beam oscillated by the pulsed laser beam oscillating means to a circularly-polarized pulsed laser beam.

* * * * *